(12) United States Patent
Chai et al.

(10) Patent No.: US 12,231,149 B2
(45) Date of Patent: Feb. 18, 2025

(54) METHOD, APPARATUS, AND DEVICE FOR DECODING ERROR CORRECTION CODE, AND STORAGE MEDIUM

(71) Applicant: Tongxin Microelectronics Co., Ltd., Beijing (CN)

(72) Inventors: Sen Chai, Beijing (CN); Kai Zhang, Beijing (CN)

(73) Assignee: TONGXIN MICROELECTRONICS CO., LTD., Beijing (CN)

( * ) Notice: Subject to any disclaimer, the term of this patent is extended or adjusted under 35 U.S.C. 154(b) by 0 days.

(21) Appl. No.: 18/344,604

(22) Filed: Jun. 29, 2023

(65) Prior Publication Data

US 2024/0223221 A1 Jul. 4, 2024

(30) Foreign Application Priority Data

Dec. 30, 2022 (CN) .......................... 202211738080.1

(51) Int. Cl.
*H03M 13/00* (2006.01)
(52) U.S. Cl.
CPC .............................. *H03M 13/6516* (2013.01)
(58) Field of Classification Search
CPC ........... H03M 13/6516; H03M 13/617; H03M 13/373
See application file for complete search history.

(56) References Cited

U.S. PATENT DOCUMENTS

| 5,343,481 | A * | 8/1994 | Kraft ..................... | H03M 13/00 |
| | | | | 714/782 |
| 2015/0155885 | A1* | 6/2015 | Ikegaya ............ | H03M 13/1545 |
| | | | | 714/785 |
| 2018/0138926 | A1* | 5/2018 | Jiang ................... | H03M 13/617 |

OTHER PUBLICATIONS

Extended European Search Report regarding Application No. 23182844.3, dated May 29, 2024.
Singh Saurabh et al: "Report on Cryptographic Hardware Design using Vedic Mathematics", Proc., IEEE International Conference On Technological Advancements and Innovations (ICTAI), Nov. 10, 2021 (Nov. 10, 2021), pp. 659-664, XP034067431, DOI: 10.1109/ICTAI53825.2021.9673162 (retrieved on Jan. 5, 2022).

(Continued)

*Primary Examiner* — Esaw T Abraham
(74) *Attorney, Agent, or Firm* — Harness, Dickey & Pierce, P.L.C.

(57) ABSTRACT

A method for decoding an error correction code is provided. The method includes: acquiring a Galois field equation corresponding to the error correction code; determining a target relational expression corresponding to error locations after decoding the error correction code; determining multiple conjugate location pairs based on the target relational expression; determining a first polynomial corresponding to an exponential coefficient of a first location in a conjugate location pair and a second polynomial corresponding to an exponential coefficient of a second location in the conjugate location pair based on a correspondence table between exponents and polynomials; performing an exclusive OR operation on coefficients of the first polynomial and the second polynomial to obtain an exclusive OR result; and determining the first location and the second location as error locations, in a case that the exclusive OR result matches a target coefficient of the Galois field equation.

15 Claims, 4 Drawing Sheets

(56) References Cited

OTHER PUBLICATIONS

Alaspure Dinubhau B et al: "FPGA based Vedic Mathematics Applications: An Eagle Eye", Proc., IEEE Third International Conference On Inventive Research in Computing Applications (ICIRCA), Sep. 2, 2021 (Sep. 2, 2021), pp. 1814-1820, XP033979558, DOI: 10.1109/ICIRCA51532.2021.9544569 (retrieved on Sep. 21, 2021).

Parthasarathi R et al: "Multiple precision square root using the Dwandwa square-root algorithm", Journal of Systems Architecture, Elsevier BV, NL, vol. 44, No. 2, Nov. 1, 1997 (Nov. 1, 1997), pp. 143-158, XP004096546, ISSN: 1383-7621, DOI: 10.1016/S1383-7621(97)00006-4.

C Santhamma: "Cube root of a Number / Polynomial by Vedic method", International Journal of Scientific Engineering and Applied Science, IJSEAS, vol. 6, No. 6, Jun. 1, 2020 (Jun. 1, 2020), pp. 1-9, XP093155469, ISSN: 2395-3470, Retrieved from the Internet on Apr. 3, 2024: https://ijseas.com/volume6/v6i6/ijseas20200611.pdf.

\* cited by examiner

METHOD, APPARATUS, AND DEVICE FOR DECODING ERROR CORRECTION CODE, AND STORAGE MEDIUM

CROSS-REFERENCE TO RELATED APPLICATIONS

This application claims the priority to Chinese Patent Application No. 202211738080.1, titled "METHOD, APPARATUS, AND DEVICE FOR DECODING ERROR CORRECTION CODE, AND STORAGE MEDIUM", filed on Dec. 30, 2022 with the Chinese Patent Office, which is incorporated herein by reference in its entirety.

FIELD

The present disclosure relates to the technical field of computers, and in particular to a method, an apparatus and a device for decoding an error correction code, and a medium.

BACKGROUND

A BCH code is a linear block code in a finite field (Galois field), which can be used to correct multiple random errors and is commonly used for error-correcting encoding in the fields of communication and storage. BCH codes are block codes obtained by dividing a to-be-sent information sequence into message groups having a fixed number of digits, and converting each of the message groups into a binary digital group. The process of converting a message group into a code word is referred to as encoding, and an inverse process of which is referred to as decoding.

For example, a BCH error correction code with an error-correcting capability of 2 is mainly used for error correction in a scenario of flash storage, that is, the error correction code is decoded to obtain information of two error locations in the flash storage. The critical step in the decoding is the calculation of a root of a quadratic equation with one variable in the Galois field corresponding to the BCH error correction code. In the conventional technology, the root is calculated by: traversing all values in the Galois field, substituting each of the values into the quadratic equation with one variable and determining whether the equation is equal to zero, which results in a large calculation amount for solving the root and thus a complex decoding process.

SUMMARY

In view of the above, a method, an apparatus and a device for decoding an error correction code, and a medium are provided according to the present disclosure, to reduce the calculation amount and complexity in the decoding process.

In a first aspect, a method for decoding an error correction code is provided according to the present disclosure, which includes: acquiring a Galois field equation corresponding to the error correction code, where a total length of the error correction code is a predetermined number of digits; determining a target relational expression corresponding to multiple error locations after decoding the error correction code based on the Galois field equation, wherein the target relational expression is derived based on the Vedic theorem; determining multiple conjugate location pairs based on the target relational expression; for each of the multiple conjugate location pairs, determining a first polynomial corresponding to an exponential coefficient of a first location in the conjugate location pair and a second polynomial corresponding to an exponential coefficient of a second location in the conjugate location pair based on a correspondence table between exponents and polynomials in a Galois field; performing an exclusive OR operation on coefficients of the first polynomial and the second polynomial to obtain an exclusive OR result; and determining the first location and the second location as error locations, in a case that the exclusive OR result matches a target coefficient of the Galois field equation.

In an embodiment, the performing the exclusive OR operation on the coefficients of the first polynomial and the second polynomial to obtain the exclusive OR result includes: determining multiple matching term pairs, where each of the multiple matching term pairs includes a term in the first polynomial and a term in the second polynomial that have a same power of exponent; and for each of the multiple matching term pairs, performing an exclusive OR operation on two coefficients of terms in the matching term pair, to obtain an exclusive OR result of the multiple matching term pairs.

In an embodiment, the determining that the exclusive OR result matches a target coefficient of the Galois field equation includes: acquiring the target coefficient of the Galois field equation, where the target coefficient is a coefficient of a first order term in the Galois field equation; determining a target polynomial corresponding to the target coefficient based on the correspondence table between exponents and polynomials; and matching with a coefficient of the target polynomial based on the exclusive OR result.

In an embodiment, a process of deriving the target relational expression based on the Veda theorem includes: determining a first exponent corresponding to a first coefficient of the Galois field equation based on a generator of the Galois field equation, where the first coefficient is a coefficient of a term with a highest exponent; determining a second exponent corresponding to a first root of the Galois field equation and a third exponent corresponding to a second root of the Galois field equation, based on the generator; determining a product relational expression of the second exponent and the third exponent based on the Veda theorem, where the product relational expression includes the first exponent; and determining the target relational expression based on the product relational expression, where the first root and the first error location have a reciprocal relation with each other, and the second root and the second error location have a reciprocal relation with each other.

In an embodiment, the determining the target relational expression based on the product relational expression includes: performing a logarithmic operation on both sides of the product relational expression to obtain a summation relational expression; and determining the target relational expression based on the summation relational expression, the reciprocal relation between the first root and the first error location, and the reciprocal relation between the second root and the second error location.

In an embodiment, the determining the multiple conjugate location pairs based on the target relational expression includes: determining a midpoint based on the target relational expression; determining a first location range and a second location range corresponding to the midpoint based on the midpoint and a value range of the Galois field equation, where the first location range is not overlapped with the second location range, and the first location range, the second location range, and the midpoint constitute the value range of the Galois field equation; and determining a first location in the first location range and a second location in the second location range, wherein the first location and the second location form a conjugate location pair, where a distance from the first location to the midpoint is equal to a distance from the second location to the midpoint.

In an embodiment, the Galois field equation is a quadratic equation with one variable.

In a second aspect, an apparatus for decoding an error correction code is provided according to the present disclosure, which includes: a first acquiring unit, configured to acquire a Galois field equation corresponding to the error correction code, where a total length of the error correction code is a predetermined number of digits; a first determining unit, configured to determine a target relational expression corresponding to multiple error locations after decoding the error correction code based on the Galois field equation, wherein the target relational expression is derived based on the Vedic theorem; a second determining unit, configured to determine multiple conjugate location pairs based on the target relational expression; a third determining unit, configured to for each of the multiple conjugate location pairs, determine a first polynomial corresponding to an exponential coefficient of a first location in the conjugate location pair and a second polynomial corresponding to an exponential coefficient of a second location in the conjugate location pair, based on a correspondence table between exponents and polynomials in a Galois field; a second acquiring unit, configured to perform an exclusive OR operation on coefficients of the first polynomial and the second polynomial to obtain an exclusive OR result; and a fourth determining unit, configured to determine the first location and the second location as error locations, in a case that the exclusive OR result matches a target coefficient of the Galois field equation.

In a third aspect, a device for decoding an error correction code is provided according to the present disclosure, and the device includes a memory and a processor. The memory is configured to store a program. The processor is configured to execute the program to perform the method for decoding an error correction code according to any one of the embodiments in the first aspect described above.

In a fourth aspect, a computer-readable storage medium is provided according to the present disclosure. The computer-readable storage medium is used to store a computer program, where the computer program, when being executed by a processor, causes the processor to perform the method for decoding an error correction code according to any one of the embodiments in the first aspect described above.

It can be seen that the present disclosure has the following beneficial effects. In the above embodiments of the present disclosure, in decoding the error correction code, the Galois field equation corresponding to the error correction code may be acquired, where the total length of the error correction code is the predetermined number of digits. The target relational expression corresponding to multiple error locations after decoding the error correction code is determined based on the Galois field equation and the Veda theorem. Multiple conjugate location pairs are determined based on the target relational expression. For each of the multiple conjugate location pairs, a first polynomial corresponding to an exponential coefficient of a first location in the conjugate location pair and a second polynomial corresponding to an exponential coefficient of a second location in the conjugate location pair are determined based on a correspondence table between exponents and polynomials in the Galois field. An exclusive OR operation is performed on coefficients of the first polynomial and the second polynomial to obtain an exclusive OR result. In a case that the exclusive OR result matches a target coefficient of the Galois field equation, the first location and the second location in the conjugate location pair are determined as error locations. With the method for decoding an error correction code according to the embodiments of the present disclosure, based on the Galois field equation and the Veda theorem, the error locations can be determined based on the correspondence table between exponents and polynomials. Therefore, it needs not to traverse all values in the Galois field, thereby reducing the calculation amount and the complexity in the decoding process.

BRIEF DESCRIPTION OF THE DRAWINGS

In order to more clearly illustrate technical solutions in embodiments of the present disclosure, the drawings to be used in the description of the embodiments are briefly described below. Apparently, the drawings in the following description show only some embodiments of the present disclosure, and other drawings may be obtained by those skilled in the art from the drawings.

DETAILED DESCRIPTION

Technical solutions in the embodiments of the present disclosure are clearly and completely described below in conjunction with the drawings of the embodiments of the present disclosure. The described embodiments are only exemplary implementations of the present disclosure, rather than all implementations. Based on the embodiments in the present disclosure, those skilled in the art may obtain other embodiments without any creative efforts, and these embodiments also fall within the protection scope of the present disclosure.

In order to facilitate the understanding of the technical solutions according to the embodiments of the present disclosure, the technical background of the embodiments of the present disclosure is described below.

A field is an algebraic system in which two mathematical operations for elements in the field are defined. The field includes an addition set for all the elements and a multiplication set for non-zero elements. The field is closure in addition and multiplication, that is, any result obtained by performing addition or multiplication on the elements in the field is still an element in the field. The multiplication and the addition in the field may be respectively defined as AND operation (module-2 addition) and exclusive OR operation in C language, but are usually represented by a symbol "+" and a symbol "*".

Assuming that a field $G=\{0, 1, 2, 3, \ldots p-1\}$ includes a set of integers, where p represents a prime number, two mathematical operations are defined as modulo-p addition and module-p multiplication in the field. In order to achieve the closure property in multiplication, p must be a prime number, and the number of elements in the set is p. Based on this, for a set of polynomials, if coefficients in the polynomials are limited to the elements in the finite field GF(p), and addition, subtraction, multiplication and division in the polynomials are redefined based on operational rules in the finite field, then the set of polynomials is referred to as a polynomial over the finite field. If GF(p) is extended to $GF(2^p)$, p is not limited to prime numbers, but $GF(2^p)$ still conforms to the operational rules of the addition and multiplication in the finite field. In other words, numerical elements in the finite field are mapped to polynomial elements, that is, the elements in the finite field are $2^p$ polynomials including 0 and 1. The finite field $GF(2^p)$ is also referred to as a Galois field.

A BCH code is a cyclic code in a Galois field, having a characteristic of on-demand design, that is, a BCH code for an application scenario is designed based on the number of errors to be corrected in the application scenario. That is, error locations are obtained by decoding the BCH code. The decoding mainly includes: obtaining an adjoint polynomial from a received polynomial, determining coefficients of an error location polynomial based on coefficients of the adjoint polynomial, and determining an error location by solving a root of the error location polynomial. A reciprocal of the root is the determined error location.

A BCH error correction code with an error-correcting capability of 2 is mainly used for error correction in a scenario of flash storage, that is, the BCH code is decoded to obtain information about two error locations in the flash storage. The critical step of the decoding is the calculation of a root of an error location polynomial corresponding to the BCH code. Since the error-correcting capability is 2, the root to be calculated is the root of a quadratic equation with one variable in the Galois field. The elements in the Galois field are essentially polynomials. In the conventional technology of Chien searching algorithm, the root of the equation is solved by traversing all values in the Galois field to substitute each of the values into the quadratic equation with one variable and determine whether the equation is equal to zero, which results in a large calculation amount for solving the roots and thus results in a complex decoding process.

Based on this, a method for decoding an error correction code is provided according to an embodiment of the present disclosure, to reduce the calculation amount and the complexity in the decoding process. In decoding an error correction code, the Galois field equation corresponding to the error correction code is acquired, where a total length of the error correction code is a predetermined number of digits. The target relational expression corresponding to multiple error locations after decoding the error correction code is determined based on the Galois field equation and the Veda theorem. Multiple conjugate location pairs are determined based on the target relational expression. For each of the multiple conjugate location pairs, a first polynomial corresponding to an exponential coefficient of a first location in the conjugate location pair and a second polynomial corresponding to an exponential coefficient of a second location in the conjugate location pair are determined based on a correspondence table between exponents and polynomials in the Galois field. An exclusive OR operation is performed on coefficients of the first polynomial and coefficients of the second polynomial to obtain an exclusive OR result. In a case that the exclusive OR result matches a target coefficient of the Galois field equation, the first location and the second location in the conjugate location pair are determined as error locations.

Hereinafter, the method for decoding an error correction code according to the embodiment of the present disclosure is described in conjunction with the drawings.

Figure 1:
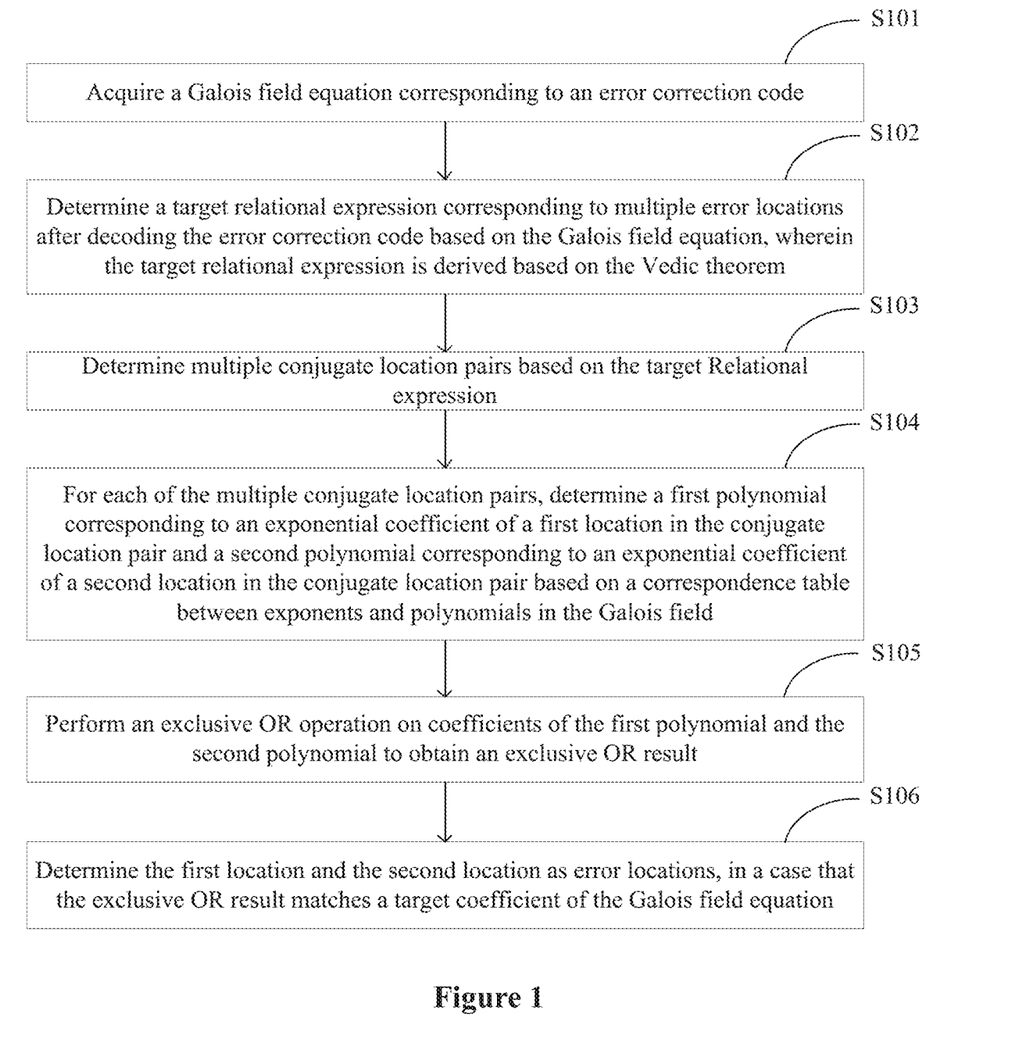
FIG. 1 is a flow chart of a method for decoding an error correction code according to an embodiment of the present disclosure.

Reference is made to FIG. 1, which is a flow chart of a method for decoding an error correction code according to an embodiment of the present disclosure.

The method includes the following steps S101 to S106.

In step S101, a Galois field equation corresponding to the error correction code is acquired.

In decoding the error correction code, a Galois field equation corresponding to an error location may be determined based on a principle of decoding an error correction code, i.e., the error location polynomial described above. The decoding mainly includes: obtaining an adjoint polynomial from a received polynomial, determining coefficients of an error location polynomial based on coefficients of the adjoint polynomial, and determining an error location by solving a root of the error location polynomial. This process is similar to the process of decoding an error correction code in the conventional technology and can be implemented by a computing module of a decoding device, which is not described in detail herein.

In the embodiment of the present disclosure, the root of the Galois field equation is solved mainly based on the error correction code with the error-correcting capability of 2, that is, the Galois field equation is a quadratic equation with one variable. For example, the error correction code may be a BCH code. A total length of the error correction code may be preset according to actual requirements of the flash storage, that is, the total length of the error correction code is a predetermined number of digits. For example, the total length of the error correction code may be preset to 225 digits or 144 digits, which is not limited herein.

In step S102, a target relational expression corresponding to multiple error locations after decoding the error correction code is determined based on the Galois field equation and the Veda theorem.

In a case that the error-correcting capability is 2, the Galois field equation is a quadratic equation with one variable. The embodiment is described by using an example that the Galois field equation has two different roots. The Galois field equation conforms to the Veda theorem. Since reciprocals of the roots of the Galois field equation are the to-be-determined error locations, the target relational expression corresponding to the two error locations can be derived based on the Veda theorem.

The Galois field has a generator, where each of non-zero elements in the Galois field can be expressed by the generator raised to a power, that is, an exponential form of the generator. In a specific implementation, a first exponent corresponding to a first coefficient of the Galois field equation may be determined based on the generator of the Galois field equation. That is, the first coefficient of the Galois field equation is expressed in the exponential form of the generator. A second exponent corresponding to a first root of the Galois field equation and a third exponent corresponding to a second root of the Galois field equation are determined based on the generator. That is, the two roots of the Galois field equation are expressed in exponential forms of the generator, where the powers given to the generator to express the roots may be expressed by a variable. A product relational expression of the second exponent and the third exponent is determined based on the Veda theorem. That is, the product relational expression of the two roots of the Galois field equation may be determined based on the Veda theorem. Since the two roots are expressed in the exponential form of the generator, the product relational expression of the second exponent and the third exponent can be determined. According to the Veda theorem, a product of two roots of an equation can be expressed by a coefficient of a term with a highest exponent and a coefficient of a constant term, that is, the product can be expressed by the first coefficient and the coefficient of the constant term. Therefore, the product relational expression includes the first exponent corresponding to the first coefficient. According to the above embodiment, since the reciprocals of the roots of the Galois field equation are the error locations, the target relational expression corresponding to the two error locations can be determined based on the product relational expression of the two roots.

In an embodiment, after the product relational expression of the second exponent and the third exponent is determined, a logarithmic operation is performed on both sides of the product relational expression to obtain a summation relational expression. The target relational expression corresponding to the first error location and the second error location is determined based on the summation relational expression, the reciprocal relation between the first root and the first error location, and the reciprocal relation between the second root and the second error location. Hereinafter, the principle of deriving the target relational expression based on Veda theorem is described in conjunction with an application scenario.

In the application scenario, the Galois field equation is expressed as $u_1 x^2 + u_2 x + 1 = 0$ ($GF(2^n)$), where the first coefficient is expressed as $u_1$. In the Galois field, the generator is expressed as a, the first coefficient $u_1$ is expressed as a first exponent of the generator a, that is, $u_1 = a^{r1}$. Two roots of the Galois field equation are expressed as a first root $x_1$ and a second root $x_2$, which are represented by a second exponent and a third exponent of the generator a, that is, $x_1 = a^{r2}$ and $x_2 = a^{r3}$. Based on the Veda theorem, a product relational expression of the first root and the second root may be expressed as $x_1 * x_2 = u_1^{-1}$, which is converted to be $a_{r2+r3} = a^{-r1}$ by using the generator a. A logarithmic operation is performed on both sides of the product relational expression to obtain a summation relational expression $r_1 + r_2 + r_3 \equiv 0 \mod(2^n - 1)$. Since the first error location $e_1$ is the reciprocal of the first root and the second error location $e_2$ is the reciprocal of the second root, the target relational expression corresponding to the first error location e and the second error location $e_2$ can be derived as $e_1 + e_2 \equiv r_3 \mod(2^n - 1)$ from the summation relational expression.

In step S103, multiple conjugate location pairs are determined based on the target relational expression.

After the target relational expression corresponding to the first error location and the second error location is determined, multiple conjugate location pairs in the flash is determined based on the target relational expression and the total length of the error correction code. Each of the multiple conjugate location pairs includes two corresponding locations.

In a specific implementation process, the target relational expression indicates an addition of two error locations, which can be used to determine a midpoint. Then a first location range and a second location range corresponding to the midpoint can be determined based on the midpoint and a value range of the Galois field equation. The first location range is not overlapped with the second location range. The first location range, the second location range, and the midpoint constitute the value range of the Galois field equation. Then, a first location is determined in the first location range, and a second location is determined in the second location range, where a distance from the first location to the midpoint is equal to a distance from the second location to the midpoint. The first location and the second location form a conjugate location pair. Multiple conjugate location pairs may be determined based on the first location range and the second location range.

In step S104, for each of the multiple conjugate location pairs, a first polynomial corresponding to an exponential coefficient of a first location in the conjugate location pair and a second polynomial corresponding to an exponential coefficient of a second location in the conjugate location pair are determined based on a correspondence table between exponents and polynomials in the Galois field.

Each of the elements in the Galois field is substantially a polynomial, where a coefficient of each term in the polynomial is 0 or 1. Each polynomial can be mapped to an exponential form based on the correspondence table between exponents and polynomials, where the exponential form corresponds to a location in the flash. Therefore, in the decoding process, the first polynomial corresponding to the exponential coefficient of the first location and the second polynomial corresponding to the exponential coefficient of the second location are determined based on the correspondence table between exponents and polynomials.

In step S105, an exclusive OR operation is performed on coefficients of the first polynomial and the second polynomial to obtain an exclusive OR result.

The exclusive OR operation is performed on multiple coefficients of the first polynomial and multiple coefficients of the second polynomial to obtain the exclusive OR result. In an embodiment, multiple matching term pairs are determined, where each of the multiple matching term pairs includes a term in the first polynomial and a term in the second polynomial that have the same power of exponent. For each of the multiple matching term pairs, an exclusive OR operation is performed on two coefficients of the terms in the matching term pair, to obtain an exclusive OR result of the multiple matching term pairs. For example, the coefficients of the first polynomial may be expressed as "1 0 0 1 1", the coefficients of the second polynomial may be expressed as "1 1 0 0 1". Therefore, the exclusive OR result is "1 0 1 0 1".

In step S106, in a case that the exclusive OR result matches a target coefficient of the Galois field equation, the first location and the second location are determined as error locations.

It is determined whether the exclusive OR result matches the target coefficient of the Galois field equation. In a case that the exclusive OR result matches the target coefficient of the Galois field equation, the first location and the second location corresponding to the exclusive OR result are determined as the error locations. In an embodiment, in a case that the Galois field equation is a quadratic equation with one variable, a coefficient of a first order term in the quadratic equation with one variable is determined as the target coefficient. Based on the correspondence table between exponents and polynomials, a target polynomial corresponding to the target coefficient is determined, and it is determined whether the exclusive OR result is the same as a coefficient of the target polynomial. In a cast that the exclusive OR result is the same as the coefficient of the target polynomial, the first location and the second location subjected to the exclusive OR operation are determined as the error locations.

For better understanding of the method for decoding an error correction code according to the embodiment of the present disclosure, the method is described in conjunction with an application scenario below.

In an application scenario, a total length of the BCH code may be set to 255 digits, and a finite field corresponding to the BCH code is $GF(2^8)$. That is, the value range of the Galois field equation is [0, 254], and the error-correcting capability is 2. The Galois field equation used for decoding is expressed as $a^{56}x^2+a^{65}x+1=0$ ($GF(2^8)$), where "a" represents the generator of the Galois field. It can be seen from the above target relational expression derived based on the Veda theorem that the target relational expression corresponding to the first error location $e_1$ and the second error location $e_2$ is expressed as $e_1+e_2=56$ mod 255, and then the midpoint may be determined as $56/2=28$. Then, the midpoint 28 is determined as a starting location, and symmetric locations with a same distance to the starting location are determined as a conjugate location pair, such as bit 27 and bit 29, bit 26 and bit 30, bit 25 and bit 31, and so on. For the conjugate location pair of bit 27 and bit 29, a polynomial in Galois field corresponding to an exponent of the bit 27 and a polynomial in Galois field corresponding to an exponent of the bit 29 are determined based on the correspondence table of exponents and polynomials. The exclusive OR operation is performed on coefficients of the two polynomials to obtain an exclusive OR result. Then it is determined whether the exclusive OR result is the same as a polynomial coefficient corresponding to a coefficient $a^{65}$ of the first order term x. If the exclusive OR result is the same as the polynomial coefficient corresponding to the coefficient $a^{65}$ of the first order term x, it is determined that the bit 27 and the bit 29 are two error locations. All conjugate location pairs are traversed until determining that an exclusive OR result corresponding to a conjugate location pair is the same as the polynomial coefficient corresponding to the coefficient of the first order term.

In another application scenario, the total length of the BCH code may be set to 144 digits, the finite field corresponding to the BCH code is $GF(2^8)$, and the error-correcting capability is 2. The Galois field equation used for decoding is expressed as $a^{67}x^2+a^{236}x+1=0$ ($GF(2^8)$), where the value range of the Galois field equation is [0, 254], and "a" represents the generator of the Galois field. It can be seen, from the above target relational expression derived based on the Veda theorem, that the target relational expression corresponding to the first error location $e_1$ and the second error location $e_2$ is expressed as $e_1+e_2=67$ mod 255, and then the midpoint may be calculated as $67/2=33.5$. The midpoint 33.5 is determined as a starting location, and symmetric locations with the same distance to the starting location are determined as a conjugate location pair, such as bit 33 and bit 34, bit 32 and bit 35, bit 31 and bit 36, and so on. For the exclusive OR process, reference is made to the embodiment of the method described above, which is not repeated herein.

With the method for decoding an error correction code according to the embodiment of the present disclosure, the traversal range for determining the error locations is reduced based on the Galois field equation and the Veda theorem, so that it is unnecessary to traverse all values, thereby reducing the calculation amount and the complexity of the decoding process.

Figure 2:
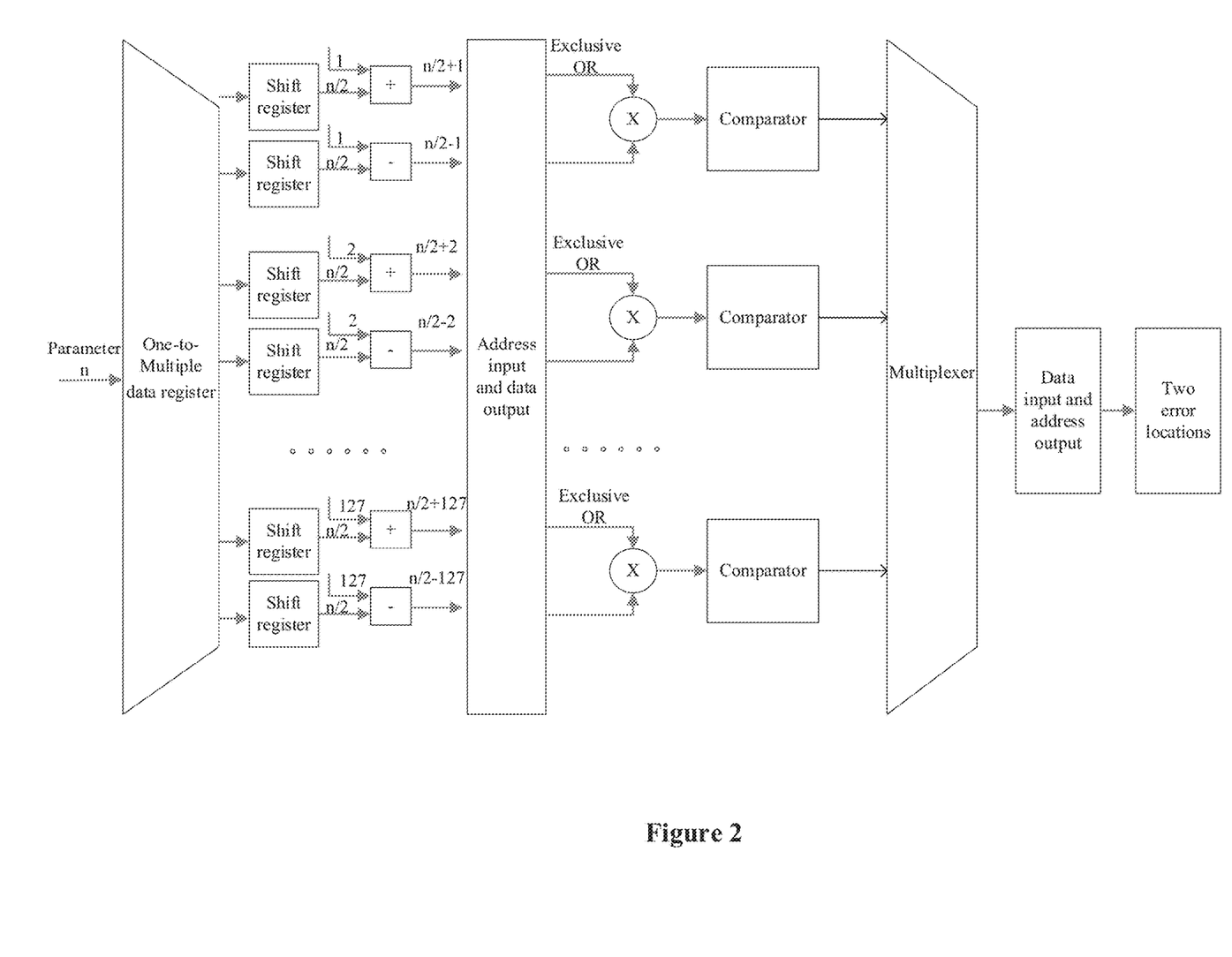
FIG. 2 is a schematic diagram of an operation principle of a conjugate exclusive OR module according to an embodiment of the present disclosure.

In an embodiment, the process of performing the exclusive OR operation based on the Galois field equation may be implemented by a conjugate exclusive OR module in a decoding device. Reference is made to FIG. 2, which is a schematic diagram of an operation principle of a conjugate exclusive OR module according to an embodiment of the present disclosure. The conjugate exclusive OR module may include a one-to-multiple data register, a shift register, a comparator, a multiplexer, and the like.

For example, a total length of an error correction code is 255 digits. A parameter n inputted into the one-to-multiple data register is assigned to 256 shift registers through the one-to-multiple data register, and then a result of n/2 is generated by each of the shift registers. In the embodiment, the parameter n may correspond to a value on the right side of the target relational expression. For example, if the target relational expression is expressed as $e_1+e_2=56$ mod 255, then n=56. Then, 127 groups of values are acquired by adding to n/2 and subtracting from n/2 same values coming from an arithmetic sequence, so as to obtain multiple conjugate location pairs. Then, the 127 groups of values are inputted through an address input and data output module to obtain polynomial values corresponding to the locations. Then the exclusive OR operation is performed on each two of the 127 groups of polynomial values to generate 127 exclusive OR results. The 127 exclusive OR results are inputted to the comparators to respectively determine whether the exclusive OR results are the same as a polynomial coefficient corresponding to the coefficient of the first order term, to obtain 127 comparison results. The 127 comparison results are transmitted to the multiplexer to determine an exclusive OR result that is the same as the polynomial coefficient corresponding to the coefficient of the first order term. According to the exclusive OR result outputted by the multiplexer, two error locations are acquired from a data input and address output module.

In the example that the length of the error correction code is 255 digits, if using the method based on the Chien search algorithm in the conventional technology to perform the calculation in one cycle, at least 128 exhaustive circuits in parallel are required, each operating a correspondence table twice for mapping an exponential form to a polynomial form. The correspondence table requires about 1500 gates if using the SMIC 40 nm CMOS process. Therefore, a total of 128*2*1500=384000 gates are required. By contrast, the solutions of the present disclosure use the exclusive OR module, which avoids the exhaustive steps. Therefore, only approximately 80000 gates are required, thereby greatly reducing hardware costs and improving decoding efficiency.

Figure 3:
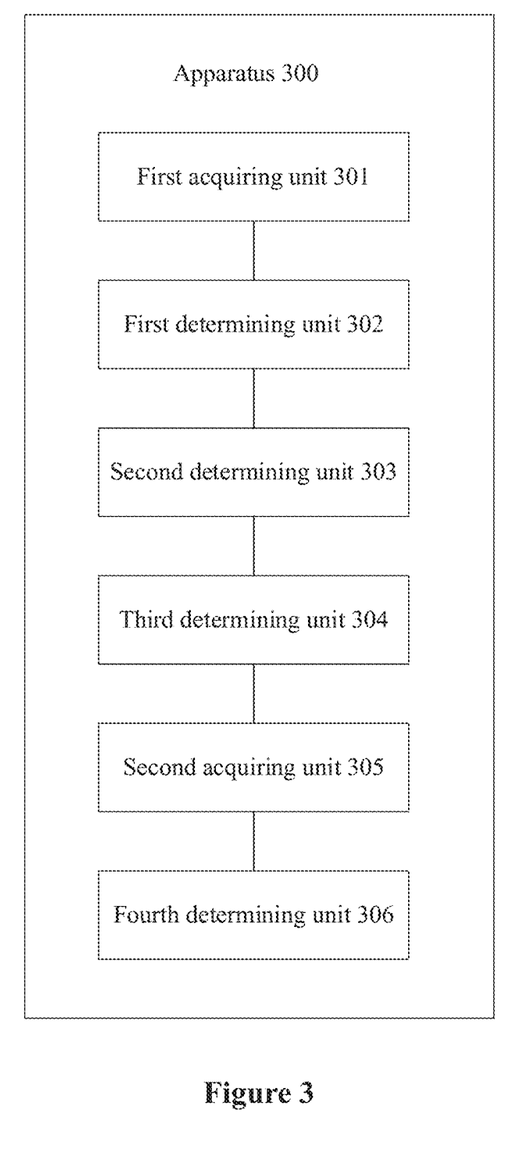
FIG. 3 is a schematic diagram of an apparatus for decoding an error correction code according to an embodiment of the present disclosure.

Based on the embodiments of the method described above, an apparatus for decoding an error correction code is further provided according to an embodiment of the present disclosure. Reference is made to FIG. 3, which is a schematic diagram of an apparatus for decoding an error correction code according to an embodiment of the present disclosure.

The apparatus 300 includes a first acquiring unit 301, a first determining unit 302, a second determining unit 303, a third determining unit 304, a second acquiring unit 305 and a fourth determining unit 306.

The first acquiring unit 301 is configured to acquire a Galois field equation corresponding to the error correction code, where a total length of the error correction code is a predetermined number of digits.

The first determining unit 302 is configured to determine a target relational expression corresponding to a plurality of error locations after decoding the error correction code based on the Galois field equation, wherein the target relational expression is derived based on the Vedic theorem.

The second determining unit 303 is configured to determine multiple conjugate location pairs based on the target relational expression.

The third determining unit 304 is configured to for each of the multiple conjugate location pairs, determine a first polynomial corresponding to an exponential coefficient of a first location in the conjugate location pair and a second polynomial corresponding to an exponential coefficient of a second location in the conjugate location pair based on a correspondence table between exponents and polynomials in a Galois field.

The second acquiring unit 305 is configured to perform an exclusive OR operation on coefficients of the first polynomial and the second polynomial to obtain an exclusive OR result.

The fourth determining unit 306 is configured to determine the first location and the second location as error locations, in a case that the exclusive OR result matches a target coefficient of the Galois field equation.

In an embodiment, the second acquiring unit 305 is configured to: determine multiple matching term pairs, where each of the multiple matching term pairs includes a term in the first polynomial and a term in the second polynomial that have a same power of exponent; and for each of the multiple matching term pairs, perform an exclusive OR operation on two coefficients of terms in the matching term pair, to obtain an exclusive OR result of the multiple matching term pairs.

In an embodiment, the determining that the exclusive OR result matches the target coefficient of the Galois field equation includes:
acquiring the target coefficient of the Galois field equation, where the target coefficient is a coefficient of a first order term in the Galois field equation; determining a target polynomial corresponding to the target coefficient based on the correspondence table between exponents and polynomials; and matching with a coefficient of the target polynomial based on the exclusive OR result.

In an embodiment, a process of deriving the target relational expression based on the Veda theorem includes:
determining a first exponent corresponding to a first coefficient of the Galois field equation based on a generator of the Galois field equation, where the first coefficient is a coefficient of a term with a highest exponent;
determining a second exponent corresponding to a first root of the Galois field equation and a third exponent corresponding to a second root of the Galois field equation based on the generator;
determining a product relational expression of the second exponent and the third exponent based on the Veda theorem, where the product relational expression includes the first exponent; and
determining the target relational expression based on the product relational expression, where the first root and the first error location have a reciprocal relation with each other, and the second root and the second error location have a reciprocal relation with each other.

In an embodiment, the first determining unit 302 is configured to:
perform a logarithmic operation on both sides of the product relational expression to obtain a summation relational expression; and
determine the target relational expression based on the summation relational expression, the reciprocal relation between the first root and the first error location, and the reciprocal relation between the second root and the second error location.

In an embodiment, the second determining unit 303 is configured to:
determine a midpoint based on the target relational expression;
determine a first location range and a second location range corresponding to the midpoint based on the midpoint and a value range of the Galois field equation, where the first location range is not overlapped with the second location range, and the first location range, the second location range, and the midpoint constitute the value range of the Galois field equation; and
determine a first location in the first location range and a second location in the second location range, wherein the first location and the second location form a conjugate location pair, where a distance from the first location to the midpoint is equal to a distance from the second location to the midpoint.

In an embodiment, the Galois field equation is a quadratic equation with one variable.

The apparatus for decoding an error correction code according to the embodiments of the present disclosure has similar beneficial effects to those of the embodiments of the method, which are not repeated herein.

Figure 4:
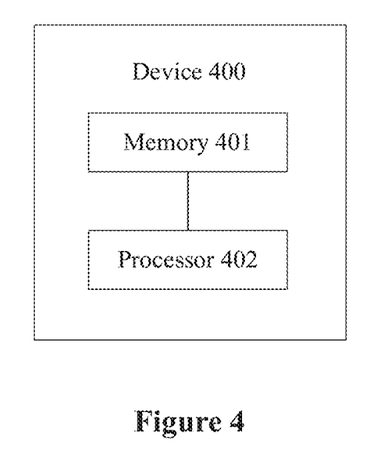
FIG. 4 is a schematic diagram of a device for decoding an error correction code according to an embodiment of the present disclosure.

Based on the embodiments of the method and the embodiments of the apparatus described above, a device for decoding an error correction code is further provided according to an embodiment of the present disclosure. Reference is made to FIG. 4, which is a schematic diagram of a device for decoding an error correction code according to an embodiment of the present disclosure.

The device 400 includes a memory 401 and a processor 402.

The memory 401 is configured to store a program.

The processor 402 is configured to execute the program to perform the method for decoding an error correction code according to the embodiment of the method described above.

Further, a computer-readable storage medium is provided according to an embodiment of the present disclosure. The computer-readable storage medium stores a computer program, where the computer program, when being executed by a processor, causes the processor to perform the method for decoding an error correction code according to the embodiment of the method described above.

It should be noted that the embodiments in this specification are described in a progressive way, each of which emphasizes the differences from others, and the same or similar parts among the embodiments may be referred to each other. In particular, since the embodiments of the system or the apparatus are basically similar to the embodiments of the method, the description of the embodiments of the system or the apparatus is relatively simple, and reference may be made to the relevant part of the embodiments of the method. The embodiments of the apparatus described above are only illustrative, units or modules described as separate components may be or may not be physically separated, the components shown as units or modules may be or may not be physical modules, that is, the components may be arranged in one location or distributed onto multiple network units. Some or all of the units or modules may be selected based on actual needs to achieve the objectives of the solutions of the embodiments. Those skilled in the art can understand and implement such embodiments of the present disclosure without any creative work.

It should be understood that in this present disclosure, the term "at least one" refers to one or more, and the term "multiple" refers to two or more. The term "and/or" is used to describe an association relationship of associated objects, and indicates three possible relationships. For example, "A and/or B" may indicate a case that there is only A, a case that there is only B, and a case that there are both A and B, where A and B may be singular or plural. The symbol "/" generally indicates that a former object and a latter object are associated by an "or" relationship. The term "at least one of" or a similar expression refers to "any combination of", including any combination of a single item or multiple items. For example, at least one of a, b or c may indicate: a, b, c, "a and b", "a and c", "b and c", or, "a and b and c", where a, b and c may be singular or plural.

It should be further noted that the relationship terminologies such as "first" and "second" are only used herein to distinguish one entity or operation from another entity or operation, rather than to necessitate or imply that the actual relationship or order exists between the entities or operations. Moreover, terms of "include", "comprise" or any other variants thereof are intended to be non-exclusive. Therefore, a process, method, article or device including a series of elements includes not only the elements but also other elements that are not explicitly listed, or also includes the elements inherent for the process, method, article or device. Unless expressively limited otherwise, the statement "comprising (including) one . . . " does not exclude the case that other similar elements may exist in the process, method, article or device.

The steps of the method or algorithm described in conjunction with the embodiments of the present disclosure may be directly implemented by hardware, a software module executed by a processor, or a combination thereof. The software module may be stored in a random-access memory (ROM), a memory, a read-only memory (ROM), an electrically programmable ROM, an electrically erasable programmable ROM, a register, a hard disk, a removable magnetic disk, a CD-ROM, or any other forms of storage medium well known in the art.

Based on the above description of the disclosed embodiments, those skilled in the art can implement or carry out the present disclosure. It is apparent for those skilled in the art to make many modifications to these embodiments. The general principle defined herein may be applied to other embodiments without departing from the spirit or scope of the present disclosure. Therefore, the present disclosure is not limited to the embodiments illustrated herein, but should be defined by the widest scope consistent with the principle and novel features disclosed herein.

The invention claimed is:

1. A method for decoding an error correction code by a decoding device comprising a processor, comprising:
    acquiring, by the processor, a Galois field equation corresponding to the error correction code, wherein a total length of the error correction code is a predetermined number of digits;
    determining, by the processor, a target relational expression corresponding to a plurality of error locations after decoding the error correction code based on the Galois field equation, wherein the target relational expression is derived based on Vieta's formulas;
    determining, by the processor, a plurality of conjugate location pairs based on the target relational expression;
    for each of the plurality of conjugate location pairs, determining, by the processor, a first polynomial corresponding to an exponential coefficient of a first location in the conjugate location pair and a second polynomial corresponding to an exponential coefficient of a second location in the conjugate location pair, based on a correspondence table between exponents and polynomials in a Galois field;
    performing, by the processor, an exclusive OR operation on coefficients of the first polynomial and the second polynomial to obtain an exclusive OR result;
    determining, by the processor, the first location and the second location as error locations, in a case that the exclusive OR result matches a target coefficient of the Galois field equation; and
    decoding, by the processor, the error correction code based on the error locations.

2. The method according to claim 1, wherein the performing, by the processor, the exclusive OR operation on the coefficients of the first polynomial and the second polynomial to obtain the exclusive OR result comprises:
    determining, by the processor, a plurality of matching term pairs, wherein each of the plurality of matching term pairs comprises a term in the first polynomial and a term in the second polynomial that have a same power of exponent; and
    for each of the plurality of matching term pairs, performing, by the processor, an exclusive OR operation on two coefficients of terms in the matching term pair, to obtain an exclusive OR result of the plurality of matching term pairs.

3. The method according to claim 2, wherein the determining, by the processor, that the exclusive OR result matches the target coefficient of the Galois field equation comprises:
    acquiring, by the processor, the target coefficient of the Galois field equation, wherein the target coefficient is a coefficient of a first order term in the Galois field equation;
    determining, by the processor, a target polynomial corresponding to the target coefficient based on the correspondence table between exponents and polynomials; and
    matching, by the processor, with a coefficient of the target polynomial based on the exclusive OR result.

4. The method according to claim 1, wherein a process of deriving the target relational expression based on the Vieta's formulas comprises:
    determining, by the processor, a first exponent corresponding to a first coefficient of the Galois field equation based on a generator of the Galois field equation, wherein the first coefficient is a coefficient of a term with a highest exponent;
    determining, by the processor, a second exponent corresponding to a first root of the Galois field equation and a third exponent corresponding to a second root of the Galois field equation, based on the generator;
    determining, by the processor, a product relational expression of the second exponent and the third exponent based on the Vieta's formulas, wherein the product relational expression comprises the first exponent; and
    determining, by the processor, the target relational expression based on the product relational expression, wherein the first root and the first error location have a reciprocal relation with each other, and the second root and the second error location have a reciprocal relation with each other.

5. The method according to claim 4, wherein the determining, by the processor, the target relational expression based on the product relational expression comprises:
    performing, by the processor, a logarithmic operation on both sides of the product relational expression to obtain a summation relational expression; and
    determining, by the processor, the target relational expression based on the summation relational expression, the reciprocal relation between the first root and the first error location, and the reciprocal relation between the second root and the second error location.

6. The method according to claim 5, wherein the determining the plurality of conjugate location pairs based on the target relational expression comprises:
   determining, by the processor, a midpoint based on the target relational expression;
   determining, by the processor, a first location range and a second location range corresponding to the midpoint based on the midpoint and a value range of the Galois field equation, wherein the first location range is not overlapped with the second location range, and the first location range, the second location range, and the midpoint constitute the value range of the Galois field equation; and
   determining, by the processor, a first location in the first location range and a second location in the second location range, wherein the first location and the second location form a conjugate location pair, wherein a distance from the first location to the midpoint is equal to a distance from the second location to the midpoint.

7. The method according to claim 1, wherein the Galois field equation is a quadratic equation with one variable.

8. A device for decoding an error correction code, comprising a memory and a processor, wherein the memory is configured to store a program; and
   the processor is configured to execute the program to perform operations of:
   acquiring a Galois field equation corresponding to the error correction code, wherein a total length of the error correction code is a predetermined number of digits;
   determining a target relational expression corresponding to a plurality of error locations after decoding the error correction code based on the Galois field equation, wherein the target relational expression is derived based on Vieta's formulas;
   determining a plurality of conjugate location pairs based on the target relational expression;
   for each of the plurality of conjugate location pairs, determining a first polynomial corresponding to an exponential coefficient of a first location in the conjugate location pair and a second polynomial corresponding to an exponential coefficient of a second location in the conjugate location pair, based on a correspondence table between exponents and polynomials in a Galois field;
   performing an exclusive OR operation on coefficients of the first polynomial and the second polynomial to obtain an exclusive OR result;
   determining the first location and the second location as error locations, in a case that the exclusive OR result matches a target coefficient of the Galois field equation; and
   decoding the error correction code based on the error locations.

9. The device according to claim 8, wherein the processor is configured to execute the program to perform operations of:
   determining a plurality of matching term pairs, wherein each of the plurality of matching term pairs comprises a term in the first polynomial and a term in the second polynomial that have a same power of exponent; and
   for each of the plurality of matching term pairs, performing an exclusive OR operation on two coefficients of terms in the matching term pair, to obtain an exclusive OR result of the plurality of matching term pairs.

10. The device according to claim 9, wherein the processor is configured to execute the program to perform operations of:
    acquiring the target coefficient of the Galois field equation, wherein the target coefficient is a coefficient of a first order term in the Galois field equation;
    determining a target polynomial corresponding to the target coefficient based on the correspondence table between exponents and polynomials; and
    matching with a coefficient of the target polynomial based on the exclusive OR result.

11. The device according to claim 8, wherein the processor is configured to execute the program to perform operations of:
    determining a first exponent corresponding to a first coefficient of the Galois field equation based on a generator of the Galois field equation, wherein the first coefficient is a coefficient of a term with a highest exponent;
    determining a second exponent corresponding to a first root of the Galois field equation and a third exponent corresponding to a second root of the Galois field equation, based on the generator;
    determining a product relational expression of the second exponent and the third exponent based on the Vieta's formulas, wherein the product relational expression comprises the first exponent; and
    determining the target relational expression based on the product relational expression, wherein the first root and the first error location have a reciprocal relation with each other, and the second root and the second error location have a reciprocal relation with each other.

12. The device according to claim 11, wherein the processor is configured to execute the program to perform operations of:
    performing a logarithmic operation on both sides of the product relational expression to obtain a summation relational expression; and
    determining the target relational expression based on the summation relational expression, the reciprocal relation between the first root and the first error location, and the reciprocal relation between the second root and the second error location.

13. The device according to claim 12, wherein the processor is configured to execute the program to perform operations of:
    determining a midpoint based on the target relational expression;
    determining a first location range and a second location range corresponding to the midpoint based on the midpoint and a value range of the Galois field equation, wherein the first location range is not overlapped with the second location range, and the first location range, the second location range, and the midpoint constitute the value range of the Galois field equation; and
    determining a first location in the first location range and a second location in the second location range, wherein the first location and the second location form a conjugate location pair, wherein a distance from the first location to the midpoint is equal to a distance from the second location to the midpoint.

14. The device according to claim 8, wherein the Galois field equation is a quadratic equation with one variable.

15. A non-transitory computer-readable storage medium, storing a computer program, wherein the computer program, when being executed by a processor, causes the processor to perform the method for decoding an error correction code according to claim 1.

* * * * *